United States Patent
Craig et al.

(10) Patent No.: US 7,576,656 B2
(45) Date of Patent: Aug. 18, 2009

(54) APPARATUSES AND METHODS FOR HIGH SPEED BONDING

(75) Inventors: Gordon S. W. Craig, Palo Alto, CA (US); Susan Swindlehurst, Morgan Hill, CA (US); Randolph W. Eisenhardt, Fargo, ND (US); Ming X. Chan, Milpitas, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 279 days.

(21) Appl. No.: 11/522,045

(22) Filed: Sep. 14, 2006

(65) Prior Publication Data

US 2007/0057796 A1 Mar. 15, 2007

Related U.S. Application Data

(60) Provisional application No. 60/717,793, filed on Sep. 15, 2005.

(51) Int. Cl.
*G08B 13/14* (2006.01)

(52) U.S. Cl. .............. 340/572.7; 340/572.1; 340/572.4; 340/572.8; 257/673; 257/674; 257/411; 235/375; 235/382; 235/492

(58) Field of Classification Search .............. 340/572.7, 340/572.1, 572.4, 572.8; 257/673, 674, 411; 235/375, 382, 492
See application file for complete search history.

(56) References Cited

U.S. PATENT DOCUMENTS

| | | | | |
|---|---|---|---|---|
| 3,706,409 A | * | 12/1972 | Lederer | 228/6.2 |
| 5,682,143 A | * | 10/1997 | Brady et al. | 340/572.7 |
| 6,606,247 B2 | | 8/2003 | Credelle et al. | |
| 6,940,408 B2 | * | 9/2005 | Ferguson et al. | 340/572.7 |
| 6,951,596 B2 | | 10/2005 | Green et al. | |
| 7,214,569 B2 | | 5/2007 | Swindlehurst et al. | |
| 2004/0183182 A1 | | 9/2004 | Swindlehurst et al. | |
| 2004/0217431 A1 | * | 11/2004 | Shimada | 257/411 |

FOREIGN PATENT DOCUMENTS

WO    WO 03/063211    7/2003

* cited by examiner

*Primary Examiner*—Tai T Nguyen
(74) *Attorney, Agent, or Firm*—Blakely, Sokoloff, Taylor & Zafman LLP

(57) ABSTRACT

Apparatuses and methods for high speed bonding for an RFID device are provided. A first substrate includes an antenna and is coupled to a strap assembly by an adhesive material. The adhesive material is substantially inert thermally for a predetermined temperature range, or it otherwise lacks a heat flow variation greater than 0.05 W/g for the predetermined temperature range. Such an adhesive material provides a reliable bond. In a specific embodiment, the predetermined temperature range is about 30° Celsius to about 85° Celsius. In an alternative embodiment, the adhesive material can be exposed to water or steam to reduce its heat flow variation to less than 0.05 W/g for the temperature range.

20 Claims, 4 Drawing Sheets form a plurality of strap assemblies. Each
APPARATUSES AND METHODS FOR HIGH SPEED BONDING This application claims benefit and priority to provisional application 60/717,793 filed on Sep. 15, 2005. The full disclosure of the provisional application is incorporated herein in its entirety.

FIELD OF THE TECHNOLOGY

The present invention relates generally to the field of bonding a first substrate to a second substrate. In particular, the present invention relates to high speed bonding of a strap assembly to an antenna substrate. More specifically, various embodiments of the present invention relate generally to the process of making Radio Frequency Identification (RFID) devices or tags in an automated roll-to-roll process.

BACKGROUND

Goods and other items may be tracked and identified using an RFID system. An RFID system includes a tag and a reader. The tag is a small transponder typically placed on an item to be tracked. The reader, sometimes referred to as an interrogator, includes a transceiver and an antenna. The antenna emits electromagnetic (EM) waves generated by the transceiver, which, when received by tag, activates the tag. Once the tag activates, it communicates using radio waves back to reader, thereby identifying the item to which it is attached.

There are three basic types of RFID tags. A beam-powered tag is a passive device which receives energy required for operation from EM waves generated by the reader. The beam powered tag rectifies an EM field and creates a change in reflectivity of the field which is reflected to and read by the reader. This is commonly referred to as continuous wave backscattering. A battery-powered semi-passive tag also receives and reflects EM waves from the reader; however a battery powers the tag independent of receiving power from the reader. An active tag actively transmits EM waves which are then received by the reader.

Many applications of RFID systems demand inexpensive tags. High speed manufacturing methods, such as roll-to-roll processes, are employed to reduce the cost of conventional tags. However, high speed processes frequently result in lower reliability and lower yield, and thus higher costs than wanted. For example, high speed bonding often introduces unreliable bonds. For RFID devices, a strap assembly can be bonded to an antenna substrate using an adhesive. Environmental conditions, such as temperature, often weaken the adhesive bond resulting in a complete failure of the tag. A different method of manufacturing RFID includes processing flexible webstock or sheetstock with embedded or surface mounted chips that are called "RFID webstock" or "RFID sheetstock". Such a method is described in U.S. patent application Ser. No. 10/323,490, filed Dec. 18, 2002, entitled "RFID LABEL TECHNIQUE" issued as U.S. Pat. No. 6,951, 596, issue date Oct. 4, 2005, and all of the embodiments illustrated and described in that disclosure are hereby incorporated by reference.

From the above it is seen that apparatuses and methods for improved bonding of RFID devices is desired.

SUMMARY OF THE DESCRIPTION

In one embodiment of the present invention, a first substrate includes an antenna and is coupled to a strap assembly by an adhesive material. The adhesive material is substantially inert thermally for a predetermined temperature range, and thus provides an improved bond between the strap assembly and the adhesive material. The strap assembly includes a second substrate and an integrated circuit In another embodiment of the present invention, a first substrate includes an antenna and is coupled to a strap assembly by an adhesive material. The adhesive material lacks a heat flow variation greater than 0.05 W/g for the predetermined temperature range. Such an adhesive material provides a reliable bond. In a specific embodiment, the predetermined temperature range is about −40° Celsius to about 85° Celsius. In an alternative embodiment, the adhesive material can be exposed to water or steam to reduce its heat flow variation to less than 0.05 W/g within the temperature range.

In yet another embodiment of the present invention, a first flexible substrate is provided. The first substrate includes a plurality of integrated circuits. Portions of the first substrate are singulated to form a plurality of strap assemblies. Each strap assembly includes at least one of the integrated circuits. A second flexible substrate with a plurality of antennas is provided. One or more strap assemblies can be coupled to corresponding antennas using an adhesive material. The adhesive material lacks a heat flow variation greater than 0.05 W/g for a temperature range.

Various additional objects, features, and advantages of the present invention can be more fully appreciated with reference to the detailed description and accompanying drawings that follow.

DESCRIPTION OF THE DRAWINGS

The present invention is illustrated by way of example and not limitation in the figures of the accompanying drawings in which like references indicate similar elements.

DETAILED DESCRIPTION

The following description and drawings are illustrative of the invention and are not to be construed as limiting the invention. Numerous specific details are described to provide a thorough understanding of the present invention. However, in certain instances, well-known or conventional details are not described in order to avoid obscuring the description of the present invention. References to one or an embodiment in the present disclosure are not necessarily references to the same embodiment; and, such references mean at least one.

Figure 1A:
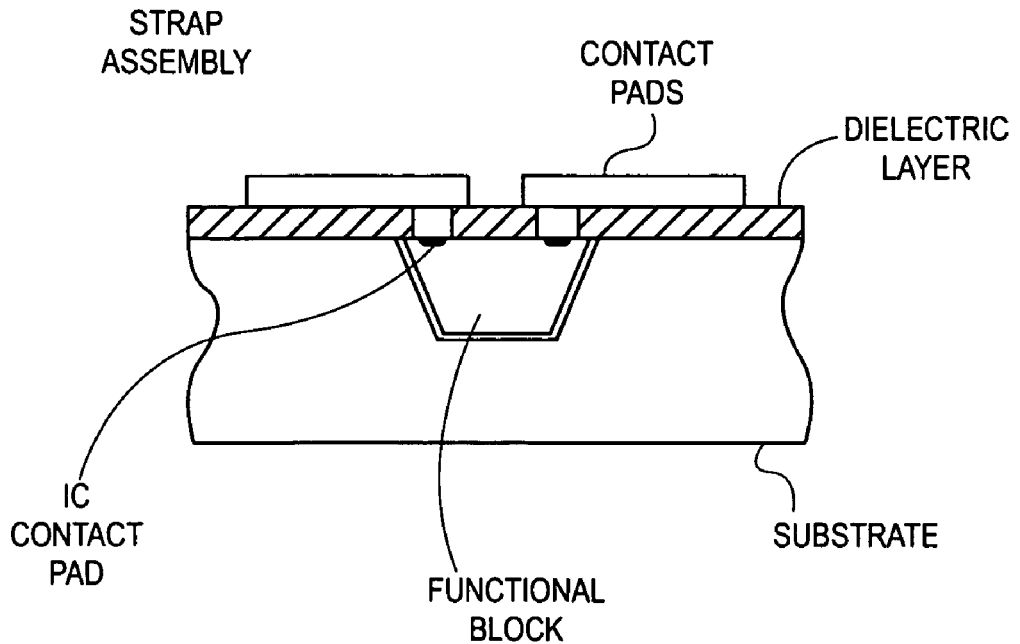
FIGS. 1A and 1B illustrate an exemplary strap assembly.
Figure 1B:
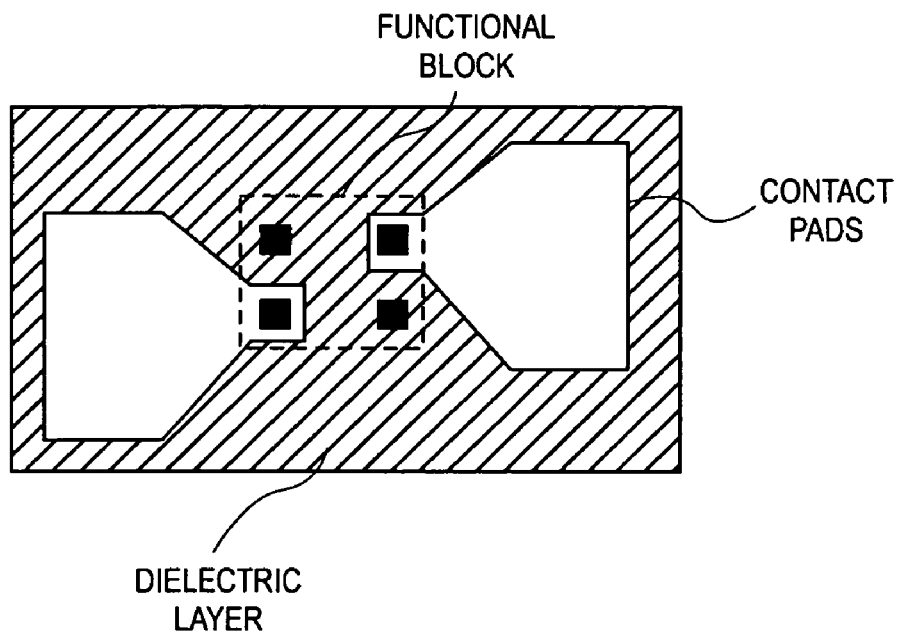

FIGS. 1A and 1B illustrate cross-sectional and top views of a strap assembly, also referred to herein as a strap. The strap includes a substrate. This substrate can be flexible or rigid, as well as monolayer or multilayer. Typically, the substrate is a flexible thermoplastic material. As shown in the figures, a functional block is embedded in the substrate, which can be accomplished by a fluidic self assembly (FSA) process. An example of a functional block is a NanoBlock® IC (integrated circuit) manufactured by Alien Technology Corporation, which may be an RFID IC, for example. Contact pads of the functional block are electrically coupled to contact pads on a surface of the strap by etched or laser drilled vias in an intermediate dielectric layer. In an alternative embodiment, an integrated circuit device can be affixed to a top surface of the substrate by pick-and-place methods (e.g., a strap with surface mounted IC). To be precise, the substrate need not include embedded blocks at all.

The contact pads of the strap are designed to provide unproblematic electrical coupling of the functional block to a large scale device, specifically an antenna for RFID applications. Additional details relating to straps and methods for making same can be found in U.S. Pat. No. 6,606,247, entitled "Multi-Feature-Size Electronic Structures," and U.S. Patent Application Publication No. 2004/0183182, entitled "Apparatus Incorporating Small-Feature-Size and Large-Feature-Size Components and Method for Making Same," all of which are hereby incorporated by reference for all purposes.

Figure 2:
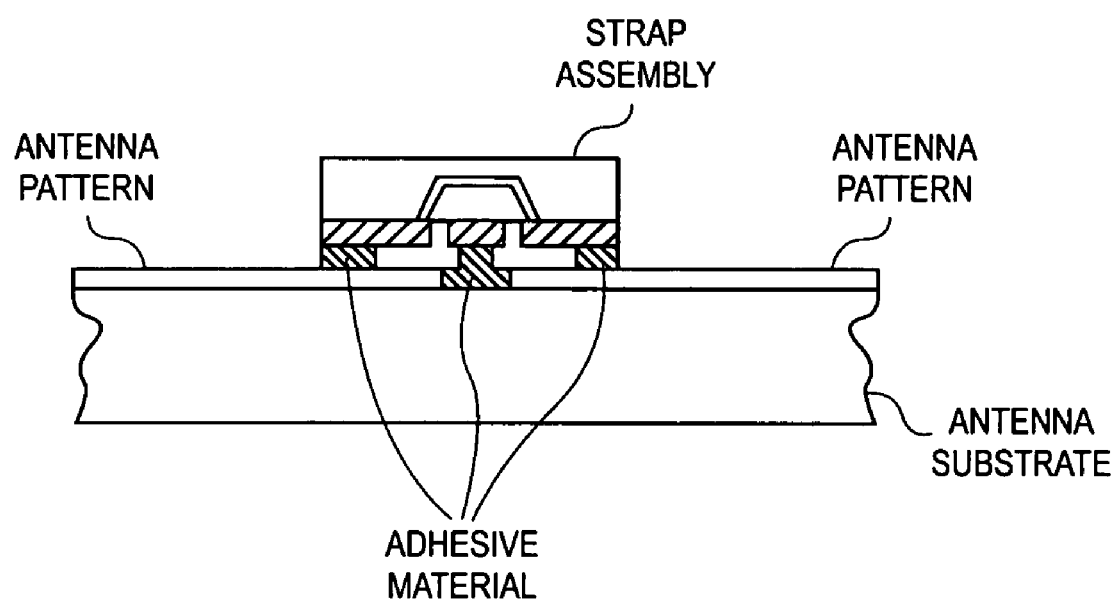
FIG. 2 illustrates an RFID inlay according to an embodiment of the present invention.

FIG. 2 illustrates an RFID inlay according to an embodiment of the present invention. The inlay (or inlet) includes a strap assembly coupled to an antenna substrate, which can be a web having one or more antennas thereon. An adhesive material is used to permanently couple the strap assembly to the antenna substrate. The adhesive material provides an improved bond over conventional techniques by being thermally inert for a temperature range of interest. Thermally inert materials, as used here, lack endothermic or exothermic chemical or physical transitions over the temperature range of interest. For example, the thermally inert adhesive materials over the temperature range of interest would not undergo significant chemical reactions or primary or secondary thermodynamic transitions, such as melting points or glass transitions. These endothermic or exothermic transitions can be observed with a number of thermal analysis techniques, including differential scanning calorimetry (DSC). In other words, the adhesive material lacks a heat flow variation greater than 0.1 W/g for the temperature range, or more preferably lacks a heat flow variation greater than 0.05 W/g. The inventors have appreciated that molecular relaxation, alteration, or reorganization leading to an increase in the electrical resistance of the strap-antenna bond is avoided, or reduced, in adhesive materials of the present invention. Adhesive materials having a heat flow variation of less than 0.1 W/g, or more preferably less than 0.05 W/g, can provide improved bonding between the RFID components, such as an RFID strap assembly or an RFID flip-chip IC, and the substrate supporting the antenna.

In an embodiment of the present invention, low temperature endotherms between about −40° Celsius to 85° Celsius can be reduce or substantially eliminated by thermal cycling for an extended, or second, cure. For example, an adhesive material after initial curing can still exhibit large endotherms. Application of a second thermal cycle or curing, for certain materials, greatly reduces endotherms. Microwave irradiation, infrared heating, site-specific laser heating, and the like can be used for heating. Another alternative is to let the material sit at ambient conditions, or else at ambient conditions and elevated humidity, for 3 to 7 days, or more.

In another embodiment, adhesive materials that are moisture-curable urethanes that can be used. The adhesive material can be exposed to water or steam prior to tacking the first substrate (e.g., strap substrate) to a second substrate (e.g., antenna substrate) or prior to the subsequent bond of the second substrate to the first substrate. The additional exposure allows the adhesive material to further, or completely, cure to provide a reliable bond. Alternatively, a light initiated adhesive can be used. The adhesive can be exposed to ultraviolet, infra-red, or high intensity visible light, or a laser beam (e.g., from a solid-state, gas, excimer, or dye laser) to initiate a chemical reaction in the adhesive to start a curing process.

Figure 3:
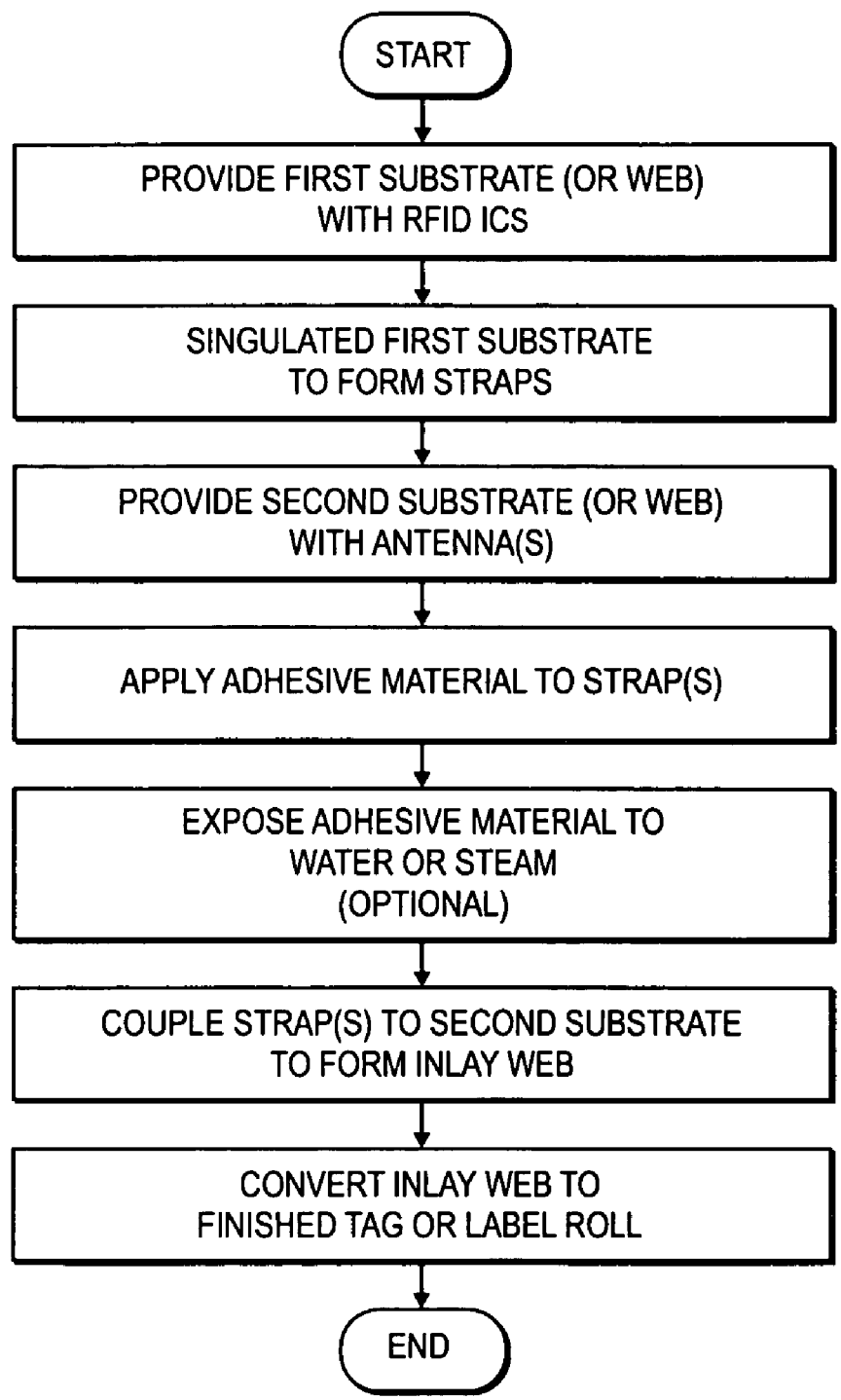
FIG. 3 illustrates a simplified flowchart representation of a method for manufacturing a tag or label according to an embodiment of the present invention.

FIG. 3 illustrates a simplified flowchart representation of a method for manufacturing a tag or label according to an embodiment of the present invention. It should be noted that the adhesive can be deposited on the antenna rather than the straps or in addition to the straps. Thereafter, generally five to ten seconds later, the strap is attached to the antenna. In one embodiment, the second substrate (or antenna web or roll) can be heated to make the adhesive tacky. After the strap is attached to the antenna (or tacked), the antenna web with attached straps is processed by a bond station where it is crimped (which can include ultrasonic bonding). Mechanical interlocking of the strap and antenna are ensured by using a knurled crimping tool.

Optionally, the method illustrated by FIG. 3 can further include testing one or more inlays on the second substrate. In the event an inlay fails the testing, it can be marked with indicia. An example of marking is using a laser on an exposed silver-ink region of the inlay. The second substrate (or web) can in a subsequent operation be visually inspected in an automated fashion and defective inlays removed (i.e., by dividing, cutting, stamping, singulating, or the like). After removal, portions of the second substrate can be spliced together as a continuous web.

Experimental Results

Figure 4:
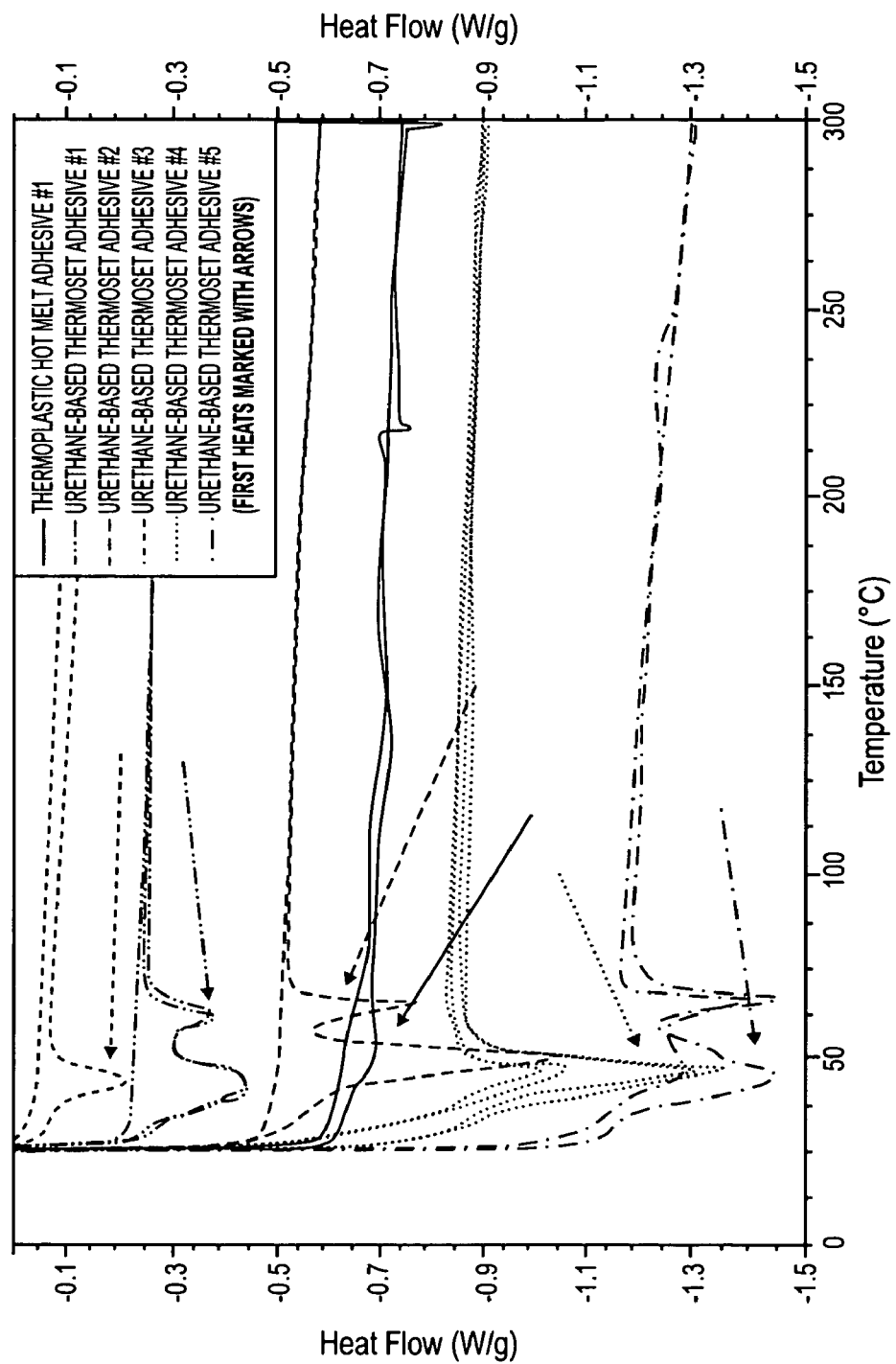
FIG. 4 shows experimental results of adhesive materials treated according to embodiments of the present invention.

The inventors tested various materials for the desired properties discussed above. FIG. 4 illustrates experimental results for heat flow. Each sample was cured by at least exposure to ambient air for a minimum of five consecutive days. As can be seen from FIG. 4, thermoplastic hot melt adhesive #1 showed relatively little change in heat flow over a temperature range of about −40° Celsius to 85° Celsius or more. That is to say, this material exhibits relatively no endotherm over the temperature range of interest. Accordingly, bonding with this thermoplastic hot melt adhesive provides greater reliability as the bond is less likely to weaken than the other tested materials.

An alternative embodiment of the present invention described herein was also tested. An adhesive was crosslinked to a point where it no longer has any meaningful endotherms. For example, urethane-based thermoset adhesive #1 was initially cured for 30 minutes at 120° Celsius followed by five days at 25° Celsius. After being thermally cycled from 25° Celsius to 150° Celsius and then back to 25° Celsius over 50 minutes, adhesive #1 no longer exhibits low temperature endotherm as shown in FIG. 4. Similarly, urethane-based thermoset adhesive #2 also lacked substantial low temperature endotherms after extended curing.

Certain embodiments are described below in the context of claim language including the following claims:

A method for manufacturing an RFID device comprising: providing a first flexible substrate with a plurality of integrated circuits coupled thereto; singulating portions of the first flexible substrate to form a plurality of strap assemblies, each of the strap assemblies including at least one of the integrated circuits; providing a second flexible substrate with a plurality of antennas thereon; coupling a strap assembly of the plurality of strap assemblies to an antenna of the second flexible substrate using an adhesive material to form an RFID inlay, the adhesive material lacking a heat flow variation great than 0.05 W/g for a predetermined temperature range. An adhesive layer and release liner is coupled to the second flexible substrate to form an RFID label roll. The same method includes testing one or more inlays on the second substrate; marking inlays with an indicia if testing results in a failure; inspecting the inlays for the indicia; dividing, stamping, or cutting the second substrate into portions to remove inlays bearing the indicia; splicing together in an automated process the portions of the second substrate. The indicia is formed by a laser. The adhesive material is at least one of urethane-based thermoset adhesive, polyamide-based hot melt adhesive, hot melt adhesives, and B-staged thermosets and wherein the RFID component is one of a flip-chip RFID IC or a strap assembly having an RFID IC.

A method for coupling an RFID component to an antenna comprising: applying an adhesive material to at least one of the RFID component and the antenna, the adhesive material lacking a heat flow variation greater than 0.05 W/g for a predetermined temperature range; bringing into contact the RFID component and the antenna to permanently couple the RFID component to the antenna. The adhesive material is at least one of urethane-based thermoset adhesive, polyamide-based hot melt adhesive, hot melt adhesives, and B-staged thermosets and wherein the RFID component is one of a flip-chip RFID IC or a strap assembly having an RFID IC. The adhesive material is at least one of urethane-based thermoset adhesive, polyamide-based hot melt adhesive, hot melt adhesives, and B-staged thermosets. A time between the bringing into contact for a first RFID device and the brining into contact for a second RFID device is less than about 0.2 second. The time is less than about 0.1 second.

An RFID device comprising: a substrate having an antenna thereon; an adhesive material, the adhesive material being substantially inert thermally for a temperature range; an RFID IC coupled to the antenna, wherein the RFID IC is coupled to the substrate by the adhesive material. The RFID IC is a flip-chip IC package having its electrical contact surface facing the substrate and wherein a conductive material couples the RFID IC to the antenna.

In the foregoing specification, the invention has been described with reference to specific exemplary embodiments thereof. It will be evident that various modifications may be made thereto without departing from the broader spirit and scope of the invention as set forth in the following claims. For example, in alternative embodiments, the adhesive materials described herein may be used to couple an RFID IC flip-chip package (which is not part of a strap assembly) to a substrate which includes an antenna thereon, and this may allow for high-speed, roll-to-roll or reel-to-reel bonding of the RFID IC flip-chip package to the substrate (e.g. the time between consecutive bonding operations on the assembly line can be less than 0.2 second or even less than 0.1 second). The specification and drawings are, accordingly, to be regarded in an illustrative sense rather than a restrictive sense.

One advantage of these adhesive systems is that they enable the use of high-speed, roll-to-roll or reel-to-reel, RFID inlet assembly by allowing the initial bond of the strap to antenna to occur very quickly. Alternative nonconductive adhesive systems might require a long bond time (one second or more) while under pressure to achieve a reliable electrical interconnection. In these systems, the bond operation can occur in 0.1 seconds or less, while maintaining a stable bond.

What is claimed is:

1. An RFID device comprising:
   a first substrate having an antenna thereon;
   an adhesive material, wherein the adhesive material is a substantially thermally inert material for a temperature range, wherein the substantially thermally inert material substantially lacks endothermic or exothermic chemical reactions or physical transitions over the temperature range, wherein the temperature range is defined by a first predetermined temperature and a second predetermined temperature, and wherein the first predetermined temperature is less than the second predetermined temperature;
   a strap permanently coupled to the antenna by the adhesive material, which has been cured, the strap comprising a second substrate and an integrated circuit.

2. The RFID device of claim 1 wherein the antenna comprises at least one of copper, aluminum, aluminum alloys, and silver ink.

3. The RFID device of claim 1 wherein the first predetermined temperature is about −40° Celsius.

4. The RFID device of claim 1 wherein the second predetermined temperature is about 85° Celsius.

5. The RFID device of claim 1 wherein the adhesive material within the temperature range lacks a heat flow variation greater than 0.05 W/g.

6. The RFID device of claim 1 wherein the adhesive material is substantially thermally inert after exposure to steam, the exposure to steam prior to attaching or bonding the strap to the antenna.

7. The RFID device of claim 1 wherein the adhesive material is subject to a plurality of temperature cycles whereby the adhesive material within the temperature range lacks a heat flow variation greater than 0.05 W/g.

8. The RFID device of claim 1 wherein the first substrate is a web having a plurality of antennas thereon.

9. The RFID device of claim 1 wherein the first and second substrates are flexible.

10. An RFID device comprising:
    a first substrate having an antenna thereon;
    an adhesive material, the adhesive material lacking a heat flow variation greater than 0.05 W/g for a predetermined temperature range, wherein the heat flow variation is related to the level of chemical reactions or primary or secondary thermodynamic transitions, wherein the temperature range is defined by a first predetermined temperature and a second predetermined temperature, and wherein the first predetermined temperature is less than the second predetermined temperature;
    a strap permanently coupled to the antenna by the adhesive material, which has been cured, the strap comprising a second substrate and an integrated circuit.

11. A method for manufacturing an RFID device comprising:
    providing a first flexible substrate with a plurality of integrated circuits coupled thereto;
    singulating portions of the first flexible substrate to form a plurality of strap assemblies, each of the strap assemblies including at least one of the integrated circuits;
    providing a second flexible substrate with a plurality of antennas thereon;
    permanently coupling a strap assembly of the plurality of strap assemblies to an antenna of the second flexible substrate using an adhesive material which has been cured, to farm an RFID inlay, the adhesive material lacking a heat flow variation greater than 0.05 W/g for a predetermined temperature range, wherein the heat flow variation is related to the level of chemical reactions or primary or secondary thermodynamic transitions, wherein the temperature range is defined by a first predetermined temperature and a second predetermined temperature, and wherein the first predetermined temperature is less than the second predetermined temperature.

12. The method of claim 11 wherein the first flexible substrate includes a plurality of receptor sites, each configured to receive a functional block using a fluidic self assembly process.

13. The method of claim 12 wherein the functional block includes an integrated circuit of the plurality of integrated circuits.

14. The method of claim 12 further comprising embossing the first flexible substrate to form the receptor sites.

15. The method of claim 11 wherein the first flexible substrate comprises at least one of plastic, paper, metal, and polymeric material.

16. The method of claim 11 further comprising exposing the adhesive material to steam, the exposing occurring prior to the coupling or the bonding.

17. The method of claim 11 wherein the predetermined temperature range is about −40° Celsius to 85° Celsius.

18. The method of claim 11 further comprising rolling up the second flexible substrate to form an RFID inlay roll.

19. The method of claim 11 further comprising singulating the RFID inlay.

20. The method of claim 11 further comprising coupling an adhesive layer and release liner to the second flexible substrate to form an RFID label roll.

\* \* \* \* \*